(12) United States Patent
Pan et al.

(10) Patent No.: US 12,621,959 B1
(45) Date of Patent: May 5, 2026

(54) DUAL-MEDIUM, LAYERED-CASCADE LIQUID-COOLING SYSTEM

(71) Applicant: Shanghai Funing GalliumCool Technologies Inc., Shanghai (CN)

(72) Inventors: Jinyi Pan, Shanghai (CN); Richard Pan, Shanghai (CN); Jianwu Pan, Shanghai (CN)

(73) Assignee: Shanghai Funing GalliumCool Technologies Inc., Shanghai (CN)

( * ) Notice: Subject to any disclaimer, the term of this patent is extended or adjusted under 35 U.S.C. 154(b) by 0 days.

(21) Appl. No.: 19/336,540

(22) Filed: Sep. 23, 2025

(30) Foreign Application Priority Data

Aug. 26, 2025 (CN) .......................... 202511203134.8

(51) Int. Cl.
*H05K 7/20* (2006.01)
*G06F 1/20* (2006.01)

(52) U.S. Cl.
CPC ........... *H05K 7/20254* (2013.01); *G06F 1/20* (2013.01); *H05K 7/20772* (2013.01)

(58) Field of Classification Search
CPC ............ H05K 7/20254; H05K 7/20772; H01L 23/473; G06F 1/20
See application file for complete search history.

(56) References Cited

U.S. PATENT DOCUMENTS 9,357,674 B2 * 5/2016 Campbell ............ H05K 7/2039
2025/0063700 A1 * 2/2025 Peterson ............ H05K 7/20772

FOREIGN PATENT DOCUMENTS

WO WO-2024237915 A1 * 11/2024 ........... H01L 23/473

* cited by examiner

*Primary Examiner* — Zachary Pape
(74) *Attorney, Agent, or Firm* — Bayramoglu Law Offices LLC

(57) ABSTRACT

A dual-medium, layered-cascade liquid-cooling heat-dissipation system includes a cold-plate assembly, a circulation loop, and a drive unit. The cold-plate assembly includes a lower-layer cold plate and an upper-layer cold plate. The lower-layer cold plate includes a first liquid-metal cold plate and a second liquid-metal cold plate located in the region of the GPU module on the main board. The upper-layer cold plate includes a large liquid-metal cold plate located in the region of the CPU module and the High Bandwidth Memory (HBM) module on the main board. First and second water-based cold plates are respectively affixed to the tops of the first and second liquid-metal cold plates, and a large water-based cold plate is affixed to the bottom of the large liquid-metal cold plate. The system achieves balanced heat transfer between the high heat-flux region of the GPU module and the lower-power region including the CPU and HBM modules.

8 Claims, 4 Drawing Sheets

DUAL-MEDIUM, LAYERED-CASCADE LIQUID-COOLING SYSTEM

CROSS REFERENCE TO THE RELATED APPLICATIONS

This application is based upon and claims priority to Chinese Patent Application No. 202511203134.8, filed on Aug. 26, 2025, the entire contents of which are incorporated herein by reference.

TECHNICAL FIELD

The present invention relates to the field of heat dissipation for computer hardware, and in particular to a dual-medium, layered, cascaded liquid-cooling heat-dissipation system.

BACKGROUND

With the rapid development of high-performance computing (HPC), artificial-intelligence training, and data centers, the power density of Graphics Processing Unit (GPU) chips has increased significantly, and the thermal design power (TDP) of a single chip has reached the kilowatt level. Traditional single-medium water-based liquid-cooling systems are often limited by cold-plate area and heat-exchange efficiency when dealing with the high heat-flux density of GPUs, resulting in excessive local hot-spot temperatures that adversely affect chip performance and service life. In typical high-end computing platforms (e.g., NVIDIA GB300 NVL72 series), GPU, Central Processing Unit (CPU), and High Bandwidth Memory (HBM) modules are usually closely arranged within the same main-board area, wherein the CPU+HBM area has lower power consumption and relatively limited heat generation. If a portion of the GPU heat can be efficiently transferred to cold plates in that area for cooperative heat dissipation, the GPU's cooling burden can be effectively dispersed and improving overall thermal management capabilities.

Also, over the past few years, the liquid cooling technology has continuously improved, forming relatively complete solutions and a comprehensive supply chain system. However, there remains a need for a solution that not only enhances GPU heat dissipation capacity but is also compatible with existing cooling systems, requires no restructuring of the CDU or heat exchanger, involves modifications only to the cold plate and local loops, has low maintenance and expansion costs.

SUMMARY

The primary objective of the present invention is to provide a dual-medium, layered, cascaded liquid-cooling heat-dissipation system to overcome the problems of the prior art, but also compatible to the existing liquid cooling systems.

To address the above technical problems, the invention adopts the following technical solution:

A dual-medium, layered, cascaded liquid-cooling heat-dissipation system including a cold-plate assembly, a circulation pipeline, and a drive unit. The cold-plate assembly includes a lower-layer cold plate and an upper-layer cold plate. The lower-layer cold plate includes a first liquid-metal cold plate and a second liquid-metal cold plate located in the region where a GPU module on the main-board chip is situated. The upper-layer cold plate includes a large liquid-metal cold plate located in a region where a CPU module and an HBM module on the main-board chip are situated. The first liquid-metal cold plate, the second liquid-metal cold plate, and the large liquid-metal cold plate are connected by the circulation pipeline to form a liquid-metal isothermal circulation system, and the drive unit is configured to drive circulation flow of a medium in the liquid-metal isothermal circulation system.

Top sides of the first and second liquid-metal cold plates are respectively bonded to or as the bottom of a first water-based cold plate and a second water-based cold plate. A bottom side of the large liquid-metal cold plate is bonded to or as the top side of large water-based cold plate. The first water-based cold plate, the second water-based cold plate, and the large water-based cold plate are connected by pipelines to form a water-based liquid-cooling heat-dissipation system, which is connected to a main liquid-cooling header/manifold, or each water-based cold plate can be direct connected the liquid-cooling manifold.

Furthermore, the main-board chip area is divided into an ultra-high-temperature region and a low-temperature region, the ultra-high-temperature region being where the GPU module is located and the low-temperature region being where the CPU and HBM modules are located. The first liquid-metal cold plate, the second liquid-metal cold plate, the first water-based cold plate, and the second water-based cold plate cover the ultra-high-temperature region, while the large liquid-metal cold plate and the large water-based cold plate cover the low-temperature region.

Furthermore, each of the first liquid-metal cold plate, the second liquid-metal cold plate, and the large liquid-metal cold plate has an plenum and microchannels and is filled with a liquid metal medium. The drive unit of the liquid metal is a magnetohydrodynamic drive (MHD) or magnet pump arranged on the circulation pipeline. When the MHD or magnet pump drives the liquid metal medium to flow, a portion of the heat absorbed from the ultra-high-temperature region is circulated to the large liquid-metal cold plate in the low-temperature region, and the large liquid-metal cold plate transfers the heat to the large water-based cold plate.

Furthermore, the first and second liquid-metal cold plates are copper-based cold plates protected by nickel plating or a ceramic coating. A bottom of each copper-based cold plate is in thermal contact with a core heat-generating area of the GPU module, and a top of each copper-based cold plate is in thermal contact with the first and second water-based cold plates. The plenum and microchannels in the liquid metal cold plates are filled with the liquid metal medium. Heat at the GPU module is transferred through the bottom of the copper-based cold plates and the microchannels to the liquid-metal medium inside, and then transfer the heat upward to the first and second water-based cold plates.

Furthermore, the large liquid-metal cold plate is configured as two independent circulation chambers or as a single integrated circulation chamber. When configured as two independent circulation chambers, the large liquid-metal cold plate is divided into a third liquid-metal cold plate and a fourth liquid-metal cold plate. The circulation pipeline includes a first liquid-metal delivery pipe, a second liquid-metal delivery pipe, a first liquid-metal return pipe, and a second liquid-metal return pipe. The MHD or magnet pump includes a first MHD or magnet pump provided on the first liquid-metal delivery pipe and a second MHD or magnet pump provided on the second liquid-metal delivery pipe. The distal ends of the first liquid metal cold plate and the third liquid metal cold plate are connected via the first liquid metal delivery pipe; the proximal ends of the first liquid metal cold plate and the third liquid metal cold plate are connected via the first liquid metal return pipe; the distal ends of the second liquid metal cold plate and the fourth liquid metal cold plate are connected via the second liquid metal delivery pipe; the proximal ends of the second liquid metal cold plate and the fourth liquid metal cold plate are connected via the second liquid metal return pipe.

Furthermore, the second water-based cold plate, the first water-based cold plate, and the large water-based cold plate are connected in series sequentially via a first water-based liquid cooling pipe and a second water-based liquid cooling pipe; the large water-based cold plate is connected to the main liquid cooling pipe via a first liquid cooling manifold; the second water-based cold plate is connected to the main liquid cooling pipe via a second liquid cooling system pipe; or alternatively, each water-based cold plate is connected directly to the main liquid cooling manifold.

Furthermore, the large water-based cold plate is configured as an integral common chamber, and the large water-based cold plate, the first water-based cold plate, and the second water-based cold plate each has the plenum and microchannels.

Furthermore, microchannels of the lower-layer first and second liquid-metal cold plates guide the liquid metal medium directly to upper portions of the respective cold plates, and the microchannels and the liquid metal medium therein transfer heat of the GPU module to microchannels of the upper-layer first and second water-based cold plates.

Furthermore, the MHD or magnet pump delivers the liquid metal medium in the ultra-high-temperature first and second liquid-metal cold plates to the large liquid-metal cold plate in the low-temperature region. The liquid metal medium transfers heat to the large liquid-metal cold plate, forming a large-area isothermal layer.

Furthermore, after the liquid metal medium in the first and second liquid-metal cold plates absorbs heat from the GPU module, a portion of the heat is transferred to the first and second water-based cold plates, and another portion is conveyed, under drive of the MHD or magnet pump, to the upper-layer large liquid-metal cold plate, which then transfers the heat to the lower-layer large water-based cold plate.

Beneficial Effects

Compared with the prior art, the invention has the following advantageous effects:

Efficient cooperative heat dissipation: The liquid metal transfers heat from the GPU module to the large liquid-metal cold plate at the CPU+HBM module area, thereby enlarging the effective heat-dissipation area. Specifically, by virtue of the high thermal conductivity of the galinstan liquid metal, heat at the GPU core is rapidly absorbed and then transferred through the microchannels and liquid metal to the first and second water-based cold plates above. Driven by the magnetohydrodynamic driver or magnet pump, the heat is further quickly conveyed to the large liquid-metal cold plate and the large water-based cold plate in the CPU+HBM area to realize efficient heat dissipation.

Distributing the cooling load: The local cooling load on the GPU cold plates is reduced and hot spots are mitigated. Utilizing the characteristics of the CPU+HBM area—lower power and less heat generation—the isothermal liquid-metal layer carries high heat from the GPU area to the large cold plates in the CPU+HBM area, thereby dispersing the GPU's cooling pressure.

Cooperative layered cooling: A layered cooperative design combining liquid metal and water-based liquid cooling is adopted. The lower-layer liquid metal at the GPU is responsible for high-heat capture and transfer, while the upper-layer water-cooling system performs final heat rejection. The two cooperate to improve overall thermal efficiency.

Independent loops to avoid thermal crosstalk: The large liquid-metal cold plate in the CPU+HBM area can be divided into two independent circulation chambers, interfacing separately with two GPUs, ensuring that heat transfer from the two GPUs does not interfere with each other and avoiding thermal crosstalk.

Strong system compatibility: The system can be directly integrated into existing water-based liquid-cooling systems with low retrofit cost.

High corrosion resistance: The liquid metal is conveyed via PTFE (polytetrafluoroethylene) pipelines, which offer resistance to high and low temperatures, strong chemical stability, and low flow resistance, suitable for long-term circulation of both liquid-metal and water-cooling media.

Multi-layer protection for liquid-metal cold plates: In view of the corrosiveness of liquid metal to metals such as copper and aluminum, the invention provides multi-stage protection for the liquid-metal cold plates. All liquid-metal cold plates are internally plated with corrosion-resistant nickel or a ceramic coating, and externally covered with a heat-shrink "jacket" of chemically inert materials.

Reusable MHD or magnet pump-driver design: Using corrosion-resistant PTFE piping with good insulation and low flow resistance serves both as the transfer pipeline and as the central conduit of the magnetohydrodynamic driver. By stacking multiple permanent-magnet assemblies and adjusting current, strong Lorentz thrust is generated. Cooling capacity can be increased simply by adjusting current and magnet assemblies without changing the liquid-metal cold-plate structure or the water-cooling system.

DESCRIPTION OF REFERENCE NUMERALS

1—First liquid metal cold plate
2—Second liquid metal cold plate
3—First water-based cold plate
4—Second water-based cold plate
5—Third liquid metal cold plate
6—Fourth liquid metal cold plate
7—Large water-based cold plate
8—First liquid cooling system pipe
9—Second liquid cooling system pipe
10—First liquid metal delivery pipe
11—Second liquid metal delivery pipe
12—First magnetohydrodynamic (MHD) or magnet pump
13—Second magnetohydrodynamic (MHD) or magnet pump
14—First liquid metal return pipe
15—Second liquid metal return pipe
16—First water-based liquid cooling pipe
17—Second water-based liquid cooling pipe

DETAILED DESCRIPTION OF THE EMBODIMENTS

The technical solution of the present invention is further described below with reference to the drawings and embodiments.

Referring to FIGS. 1-4, this embodiment provides a dual-medium, layered, cascaded liquid-cooling heat-dissipation system applicable to a high-power GPU-chip region and a lower-power component region (e.g., CPU+HBM), employing isothermal cooperative heat dissipation via liquid metal. The system decouples "high-thermal-conductivity, low-flow-rate" liquid metal from the "high-heat-capacity, large-flow-rate, and low-thermal-conductivity" water loop: the liquid metal performs near-field isothermal equalization and heat transport, while the water loop carries heat to the CDU for rejection. The two media are mutually isolated and each serves its strengths. Through cooperation between the liquid metal and the water-based coolant, efficient heat transfer and isothermal control are achieved between the GPU and the CPU+HBM regions, thereby lowering GPU hot-spot temperatures, improving overall heat-dissipation efficiency, and remaining compatible with existing liquid-cooling infrastructure.

Figure 4:
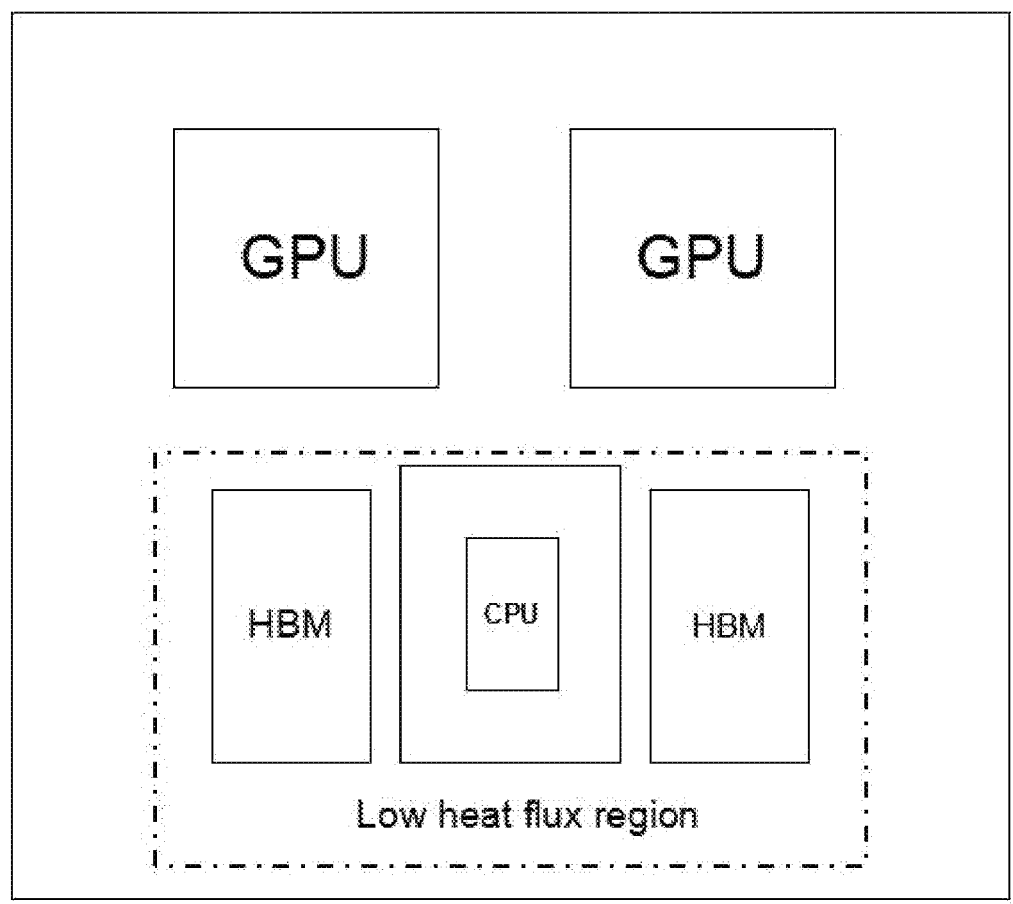
FIG. 4 is a layout diagram of the motherboard chip in the present invention.

As shown in FIG. 4, the main-board chip area is divided into an ultra-high-temperature region in which the GPU module is located and a low-temperature region in which the CPU and HBM modules are located.

Figure 1:
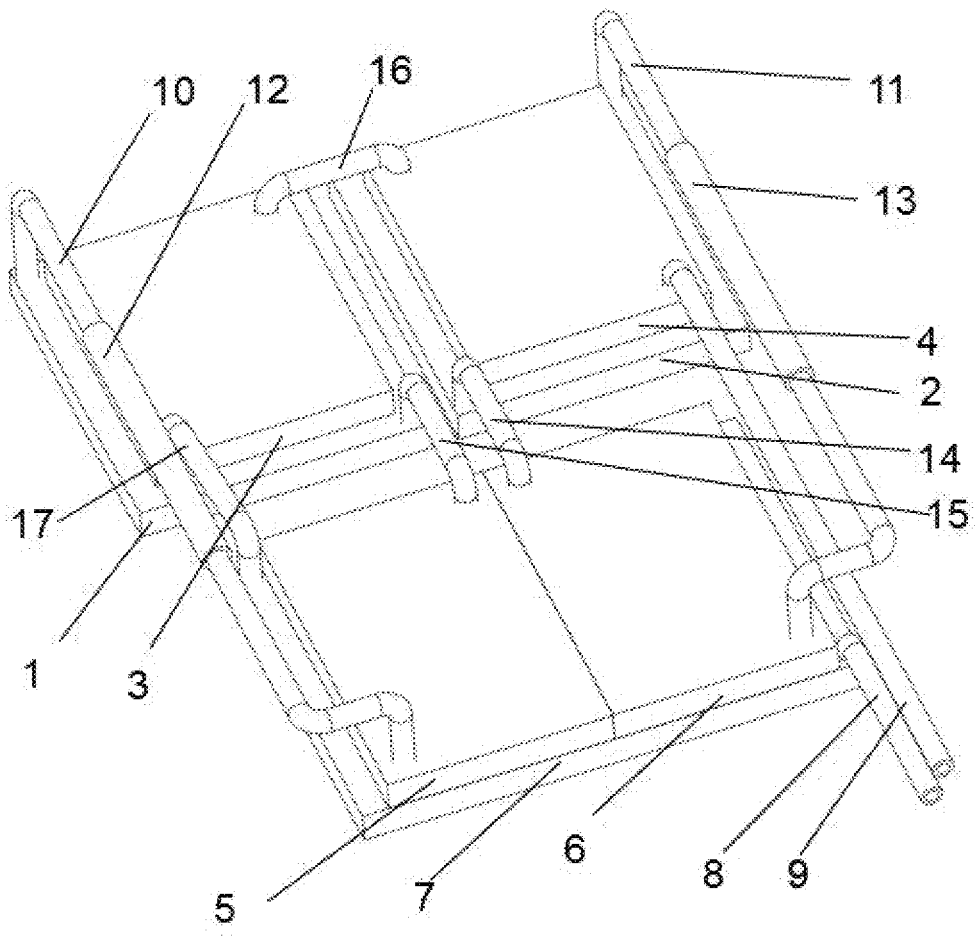
FIG. 1 is a schematic perspective view of the heat dissipation system of the present invention.
Figure 2:
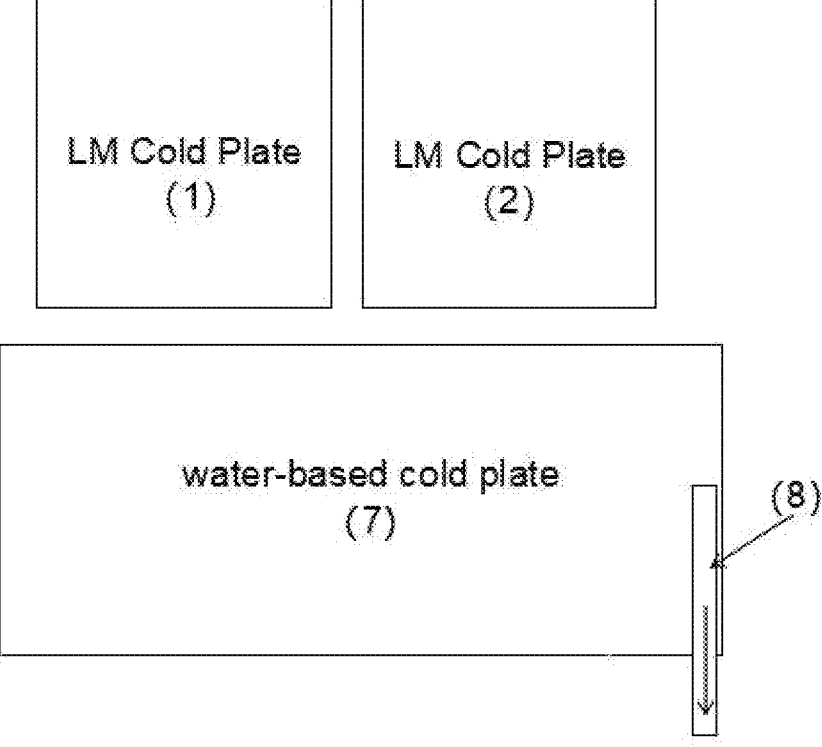
FIG. 2 is a schematic diagram of the lower cold plate structure of the present invention.
Figure 3:
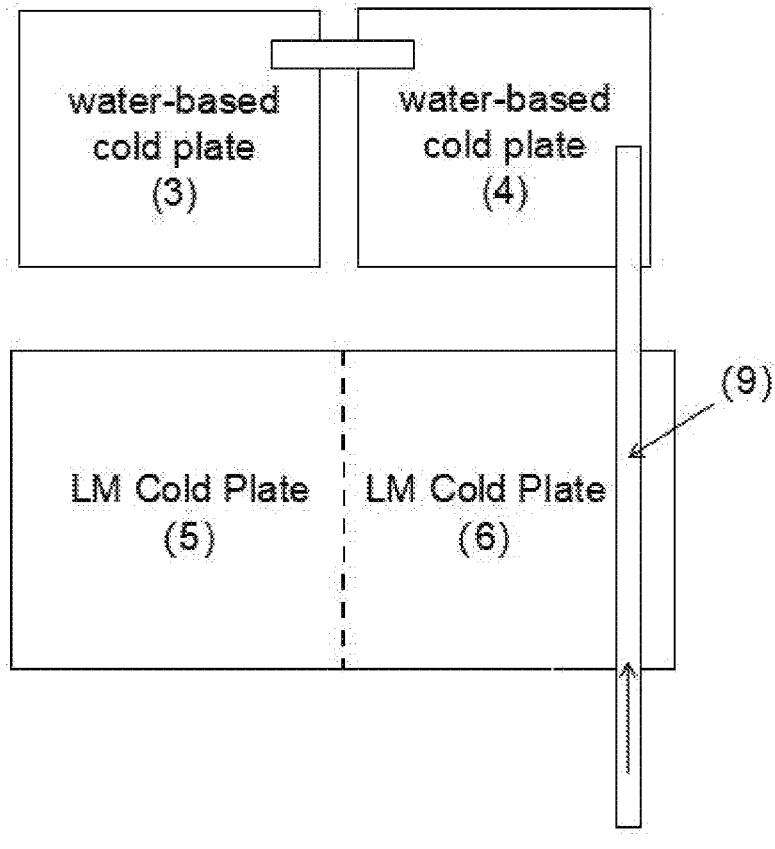
FIG. 3 is a schematic diagram of the upper cold plate structure of the present invention.

As shown in FIGS. 1-3, the system includes a cold-plate assembly, a circulation pipeline, and a drive unit.
The cold-plate assembly includes a lower-layer and an upper-layer cold plate. The lower-layer cold plate includes a first liquid-metal cold plate 1 and a second liquid-metal cold plate 2 positioned in the region of the GPU module on the main-board chip. The upper-layer cold plate includes a large liquid-metal cold plate positioned in the region of the CPU and HBM modules on the main-board chip. The first liquid-metal cold plate 1, the second liquid-metal cold plate 2, and the large liquid-metal cold plate are connected via circulation pipelines to form a liquid-metal isothermal circulation system. The drive unit drives circulation of the medium in this system. The liquid metal forms a closed-loop circulation for isothermal equalization, conveys heat from the ultra-high-temperature region to the low-temperature region, and, by virtue of its flow, achieves uniform heat removal over the entire GPU area.

Top sides of the first and second liquid-metal cold plates 1, 2 are respectively bonded to a first water-based cold plate 3 and a second water-based cold plate 4; a bottom side of the large liquid-metal cold plate is bonded to a large water-based cold plate 7. The first water-based cold plate 3, the second water-based cold plate 4, and the large water-based cold plate 7 are interconnected by pipelines to form a water-based liquid-cooling system, which is connected to a main liquid-cooling manifold. The manifold is coupled to an existing centralized CDU (coolant distribution unit) to form the water-cooling circulation loop. The area of the large water-based cold plate 7 is greater than the sum of the areas of the first and second water-based cold plates 3, 4, thereby expanding the water-cooling heat-rejection capacity by nearly a factor of two.

The circulation pipeline includes a first liquid-metal delivery pipe 10, a second liquid-metal delivery pipe 11, a first liquid-metal return pipe 14, and a second liquid-metal return pipe 15. PTFE pipes are used for circulation of the media in the system. Owing to their excellent chemical inertness, PTFE pipes pose no corrosion risk to most liquid metals, offer high electrical insulation to prevent inter-electrode current leakage, and have smooth inner walls with a friction coefficient only about one-fifth that of metal pipes.

The drive unit is a magnetohydrodynamic drive (MHD) or magnet pump including a first MHD or magnet pump pump 12 provided on the first liquid-metal delivery pipe 10 and a second MHD or magnet pump pump 13 provided on the second liquid-metal delivery pipe 11. Each MHD or magnet pump pump powers the liquid-metal circulation for a corresponding GPU module. The Lorentz force generated by the MHD or magnet pump drives the liquid metal, combining the transfer pipeline and the electromagnetic pump into one and thereby substantially reducing system space while improving liquid-cooling efficiency.

In this embodiment, anti-corrosion treatment is applied to the cold plates and pipeline joints, with particular emphasis on cold-plate regions where the liquid metal flows.

In this embodiment, the first and second liquid-metal cold plates 1, 2 and the first and second water-based cold plates 3, 4 cover the ultra-high-temperature region, while the large liquid-metal cold plate and the large water-based cold plate 7 cover the low-temperature region.

Preferably, the first liquid-metal cold plate 1, the second liquid-metal cold plate 2, and the large liquid-metal cold plate each incorporates the plenum and microchannels and is filled with liquid metal medium. The drive unit is the above-mentioned MHD or magnet pump arranged on the circulation pipeline. When the MHD or magnet pump drives the liquid metal medium to flow, a portion of the heat absorbed from the ultra-high-temperature region is circulated to the large liquid-metal cold plate in the low-temperature region, which then transfers heat to the large water-based cold plate 7.

Preferably, the first and second liquid-metal cold plates 1, 2 are copper-based cold plates protected by nickel plating or a ceramic coating. A bottom of each copper-based cold plate is in thermal contact with the core heat-generating region of the GPU module, and a top of each is in thermal contact with the first and second water-based cold plates 3, 4. The microchannels are filled with the liquid metal medium. Heat at the GPU module is transferred through the bottoms of the copper-based cold plates and the microchannels to the liquid-metal medium inside, and the copper-based cold plates further transfer heat upward to the first and second water-based cold plates 3, 4. The copper-based cold plates may use liquid metal as a TIM (thermal interface material) to conduct heat into the liquid-metal cold plates.

In this embodiment, the large liquid-metal cold plate is configured as two independent circulation chambers, divided into a third liquid-metal cold plate 5 and a fourth liquid-metal cold plate 6. The two independent chambers respectively correspond to the liquid-metal circulation of two GPU modules, enabling independent transfer of heat from the two GPUs. The first MHD or magnet pump 12 connects the lower-layer first liquid-metal cold plate 1 beneath the GPU to the third liquid-metal cold plate 5 in the CPU+HBM region to form one closed loop; the second MHD or magnet pump 13 connects the lower-layer second liquid-metal cold plate 2 beneath the GPU to the fourth liquid-metal cold plate 6 in the CPU+HBM region to form another closed loop.
In another embodiment, the large liquid-metal cold plate is configured as a single integrated circulation chamber.

Specifically, an end of the first liquid-metal cold plate 1 and an end of the third liquid-metal cold plate 5 that are remote from each other are connected to the first liquid-metal delivery pipe 10, and their adjacent ends are connected to the first liquid-metal return pipe 14. An end of the second liquid-metal cold plate 2 and an end of the fourth liquid-metal cold plate 6 that are remote from each other are connected to the second liquid-metal delivery pipe 11, and their adjacent ends are connected to the second liquid-metal return pipe 15.

In this embodiment, the outer surfaces of all liquid-metal cold plates are covered with heat-shrink "jackets" made of chemically inert fluoropolymers such as PTFE, FEP, PFA, or ETFE, so as to encapsulate weld seams, joints, and pipelines.

Preferably, the second water-based cold plate 4, the first water-based cold plate 3, and the large water-based cold plate 7 are sequentially connected in series via the first water-based liquid-cooling pipe 16 and the second water-based liquid-cooling pipe 17. The large water-based cold plate 7 is connected with the main liquid-cooling manifold via the first liquid-cooling system pipeline 8, and the second water-based cold plate 4 is connected with the main liquid-cooling manifold via the second liquid-cooling system pipeline 9. Alternatively, each water-based cold plate may be directly connected to the main liquid-cooling manifold.

In this embodiment, the large water-based cold plate 7 is configured as an integral common chamber, and the large water-based cold plate 7, the first water-based cold plate 3, and the second water-based cold plate 4 each has the plenum and microchannels.

In operation, microchannels of the lower-layer first and second liquid-metal cold plates 1, 2 guide the liquid metal medium directly to the tops of the respective cold plates. The microchannels and the liquid-metal medium therein transfer the GPU module's heat to the microchannels of the upper-layer first and second water-based cold plates 3, 4. The MHD or magnet pump delivers the liquid metal medium from the ultra-high-temperature first and second liquid-metal cold plates 1, 2 to the large liquid-metal cold plate in the low-temperature region; the liquid-metal medium transfers heat to the large liquid-metal cold plate, forming a large-area isothermal layer. After absorbing heat from the GPU chips, the liquid metal medium in the first and second liquid-metal cold plates 1, 2 transfers a portion of the heat to the upper-layer first and second water-based cold plates 3, 4, whose water-cooling system then conveys the heat via pipelines to the lower-layer large water-based cold plate 7 in the CPU+HBM region. Having also absorbed heat delivered from the third and fourth liquid-metal cold plates 5, 6 above, the large water-based cold plate 7 discharges the heat into the first and second liquid-cooling system pipelines 8, 9, and onward to the existing CDU for heat rejection.

The system adopts a dual-medium layered architecture of liquid metal and water-based coolant combined with an MHD or magnet pump to circulate the liquid metal, thereby realizing balanced heat transfer between the GPU's high heat-flux region and the CPU+HBM low-power region. By leveraging the high thermal conductivity of the liquid metal together with the upper-and-lower layered cold-plate design, part of the GPU heat is transferred to the large-area cold plate in the CPU+HBM region, significantly reducing the cooling burden on the GPU region and improving overall efficiency. The system achieves efficient cooperative cooling without changing the original water-based liquid-cooling structure (cold plates, pipelines, CDU) and is also applicable to other cooling schemes such as two-phase cooling.

In this embodiment, a flowing liquid metal with a thermal conductivity of about 40-70/m·K conveys the GPU's high heat to the large cold plate that covers the CPU+HBM low-power region. The liquid metal forms a wider isothermal layer, enlarging the effective area of traditional liquid-cooling heat dissipation and improving GPU cooling efficiency. The first and second liquid-metal cold plates 1, 2 typically have sizes of 1,600-2,000 mm$^2$ each, for a combined area of about 3,200-4,000 mm$^2$; the large liquid-metal cold plate in the CPU+HBM region has a size of 6,000-8,000 mm$^2$. A portion of the heat absorbed by the liquid metal from the GPU is circulated to the large-plate region; the liquid metal then transfers the heat to the large water-based cold plate 7 beneath, where effectively more than doubling the water-based liquid-cooling area of the GPU region and substantially increasing the water-cooling heat-rejection capacity.

The foregoing describes preferred embodiments and does not limit the scope of the invention. Any minor modifications, equivalent substitutions, or alterations made based on the technical spirit of the present invention shall fall within the scope of the claimed technical solution.

The invention claimed is:

1. A dual-medium, layered, cascaded liquid-cooling heat-dissipation system, comprising a cold-plate assembly, a circulation pipeline, and a drive unit; wherein the cold-plate assembly comprises a lower-layer cold plate and an upper-layer cold plate, wherein the lower-layer cold plate comprises a first liquid-metal cold plate and a second liquid-metal cold plate located in an area corresponding to a Graphics Processing Unit (GPU) module on a motherboard chip, and the upper-layer cold plate comprises a large liquid-metal cold plate located in a region corresponding to a Central Processing Unit (CPU) module and a High Bandwidth Memory (HBM) module on the motherboard chip; the first liquid-metal cold plate, the second liquid-metal cold plate, and the large liquid-metal cold plate are connected by the circulation pipeline to form a liquid-metal isothermal circulation system, and the drive unit is configured to drive medium in the liquid-metal isothermal circulation system; and a top side of the first liquid-metal cold plate and a top side of the second liquid-metal cold plate are respectively bonded to a first water-based cold plate and a second water-based cold plate, a bottom side of the large liquid-metal cold plate is bonded to a third water-based cold plate, and the first water-based cold plate, the second water-based cold plate, and the third water-based cold plate are connected by pipelines to form a water-based liquid-cooling heat-dissipation system, wherein the water-based liquid-cooling heat-dissipation system is connected to a main liquid-cooling manifold.

2. The system of claim 1, wherein a chip area on a main board is divided into a first region and a second region, wherein the first region has a higher temperature than the second region, wherein the GPU module is located in the first region, and the CPU module and the HBM module are located in the second region; the first liquid-metal cold plate, the second liquid-metal cold plate, the first water-based cold plate, and the second water-based cold plate cover the first region, and the large liquid-metal cold plate and the third water-based cold plate cover the second region.

3. The system of claim 2, wherein the first liquid-metal cold plate, the second liquid-metal cold plate, and the large liquid metal cold plate are filled with a liquid metal medium; the drive unit employs a magnetohydrodynamic drive (MHD) or magnet pump; the MHD or magnet pump is arranged on the circulation pipeline; when the MHD or magnet pump drives a flow of the liquid metal medium, a part of a heat absorbed from the first region is circulated by the liquid metal medium to the large liquid metal cold plate in the second region; and the large liquid metal cold plate transfers the heat to the third water-based cold plate.

4. The system of claim 3, wherein the first liquid-metal cold plate and the second liquid-metal cold plate are copper-based cold plates protected by nickel plating or a ceramic coating, wherein a bottom of each of the copper-based cold plates is in thermal contact with a core heat-generating area of the GPU module, and a top of each of the copper-based cold plates is in contact with a bottom of the first water-based cold plate and a bottom of the second water-based cold plate, such that heat at the GPU module is transferred through the bottom of the copper-based cold plates to the liquid-metal medium inside, and the copper-based cold plates further transfer the heat upward to the first water-based cold plate and the second water-based cold plate.

5. The system of claim 3, wherein the large liquid-metal cold plate is configured as two independent circulation chambers or as a single integrated circulation chamber; when configured as two independent circulation chambers, the large liquid-metal cold plate is divided into a third liquid-metal cold plate and a fourth liquid-metal cold plate;

the circulation pipeline comprises a first liquid-metal delivery pipe, a second liquid-metal delivery pipe, a first liquid-metal return pipe, and a second liquid-metal return pipe, and the MHD or magnet pump comprises a first MHD or magnet pump provided on the first liquid-metal delivery pipe and a second MHD or magnet pump provided on the second liquid-metal delivery pipe; and a first end of the first liquid-metal cold plate and a first end of the third liquid-metal cold plate are remote from each other and are connected by the first liquid-metal delivery pipe; a second end of the first liquid-metal cold plate and a second end of the third liquid-metal cold plate are adjacent to each other and are connected by the first liquid-metal return pipe; a first end of the second liquid-metal cold plate and a first end of the fourth liquid-metal cold plate are remote from each other and are connected by the second liquid-metal delivery pipe; and a second end of the second liquid-metal cold plate and a second end of the fourth liquid-metal cold plate are adjacent to each other and are connected by the second liquid-metal return pipe.

6. The system of claim 3, wherein the MHD or magnet pump delivers the liquid metal medium from the first liquid-metal cold plate and the second liquid-metal cold plate in the first region to the large liquid-metal cold plate in the second region, wherein the liquid metal medium transfers heat to the large liquid-metal cold plate to form an isothermal layer.

7. The system of claim 6, wherein, after the liquid metal medium in the first liquid-metal cold plate and the second liquid-metal cold plate absorbs the heat from the GPU module, a first portion of the heat is transferred to the first water-based cold plate and the second water-based cold plate, and a second portion of the heat is conveyed, under drive of the MHD or magnet pump, to the large liquid-metal cold plate, wherein the large liquid-metal cold plate transfers the heat to the third water-based cold plate.

8. The system of claim 1, wherein the second water-based cold plate, the first water-based cold plate, and the third water-based cold plate are sequentially connected in series via a first water-based liquid-cooling pipe and a second water-based liquid-cooling pipe; the third water-based cold plate is connected to the main liquid-cooling manifold via a first liquid-cooling system pipeline, and the second water-based cold plate is connected to the main liquid-cooling manifold via a second liquid-cooling system pipeline; or each of the second water-based cold plate, the first water-based cold plate, and the third water-based cold plate is directly connected to the main liquid-cooling manifold.

* * * * *